(12) United States Patent
Ai et al.

(10) Patent No.: US 7,999,614 B1
(45) Date of Patent: Aug. 16, 2011

(54) POWER AMPLIFYING DEVICE WITH LINEAR CORRECTOR

(75) Inventors: Bo Ai, Beijing (CN); Zhangdui Zhong, Beijing (CN); Gang Zhu, Beijing (CN)

(73) Assignee: Beijing Jiaotong University, Beijing (CN)

( * ) Notice: Subject to any disclaimer, the term of this patent is extended or adjusted under 35 U.S.C. 154(b) by 0 days.

(21) Appl. No.: 12/853,223

(22) Filed: Aug. 9, 2010

(30) Foreign Application Priority Data

Apr. 2, 2010 (CN) .......................... 2010 1 0140861

(51) Int. Cl.
*H03F 1/26* (2006.01)
(52) U.S. Cl. ........................................ 330/149; 375/297
(58) Field of Classification Search .................... 330/149
See application file for complete search history.

(56) References Cited

U.S. PATENT DOCUMENTS

| | | | | |
|---|---|---|---|---|
| 7,366,252 B2 * | 4/2008 | Cova et al. | ..................... | 375/296 |
| 7,577,211 B2 * | 8/2009 | Braithwaite | ................... | 375/296 |
| 7,773,692 B2 * | 8/2010 | Copeland et al. | ............. | 375/297 |
| 7,808,315 B2 * | 10/2010 | Goodman et al. | ............ | 330/149 |

OTHER PUBLICATIONS

Besbes, H. et al., A fast adaptive polynomial predistorter for power amplifiers, Global Telecommunications Conference, Globecom '01, IEEE vol. 1: Digital Object Identifier: 10.1109/GLOCOM.2001. 965198, 2001, pp. 659-663.

Chang, L. et al., Analysis of amplitude and phase predistortion and polynomial-based predistortion in OFDM systems, Information, Communications & Signal Processing, 2007 6th International Conference, Digital Object Identifier: 10.1109/ICICS.2007.4449843, 2007, pp. 1-5.

Choi, S. et al., A direct learning structure for adaptive polynomial-based predistortion for power amplifier linearization, Vehicular Technology Conference, VTC2007-Spring, IEEE 65th Digital Object Identifier: 10.1109/VETECS.2007.372, 2007, pp. 1791-1795.

* cited by examiner

*Primary Examiner* — Henry K Choe
(74) *Attorney, Agent, or Firm* — Knobbe, Martens, Olson & Bear, LLP

(57) ABSTRACT

A power amplifying device with linear corrector utilizing the polynomial format to realize pre-distortion is disclosed. Its effective order estimation technique for polynomial based pre-distorter includes the following steps. Firstly, it receives the polynomial of the described pre-distorter and then, the polynomial is transformed into the matrix expression, obtaining the pre-distorter consisted of K pre-distortion functions, where K denotes the maximum order of the described polynomials. Secondly, singular value decomposition is performed for the pre-distortion matrix, obtaining singular value matrix. Thirdly, on the basis of the singular value matrix, effective rank of the pre-distortion matrix is obtained. Such effective rank of the pre-distortion matrix is determined as the effective order of the polynomial. This invention improves not only the pre-distortion performance but also lower the computational complexity of the power amplifier pre-distorter based on polynomials, which further guarantees the convergence speed and the stability of power amplifier pre-distorter based on polynomials.

10 Claims, 4 Drawing Sheets

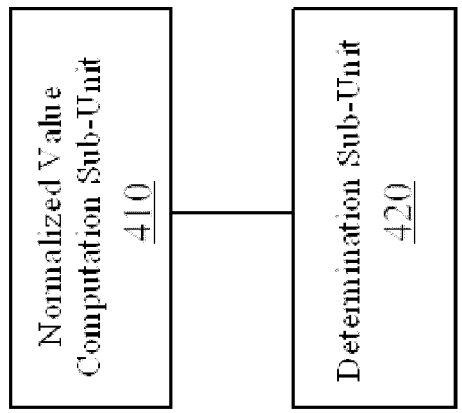
Figure 4
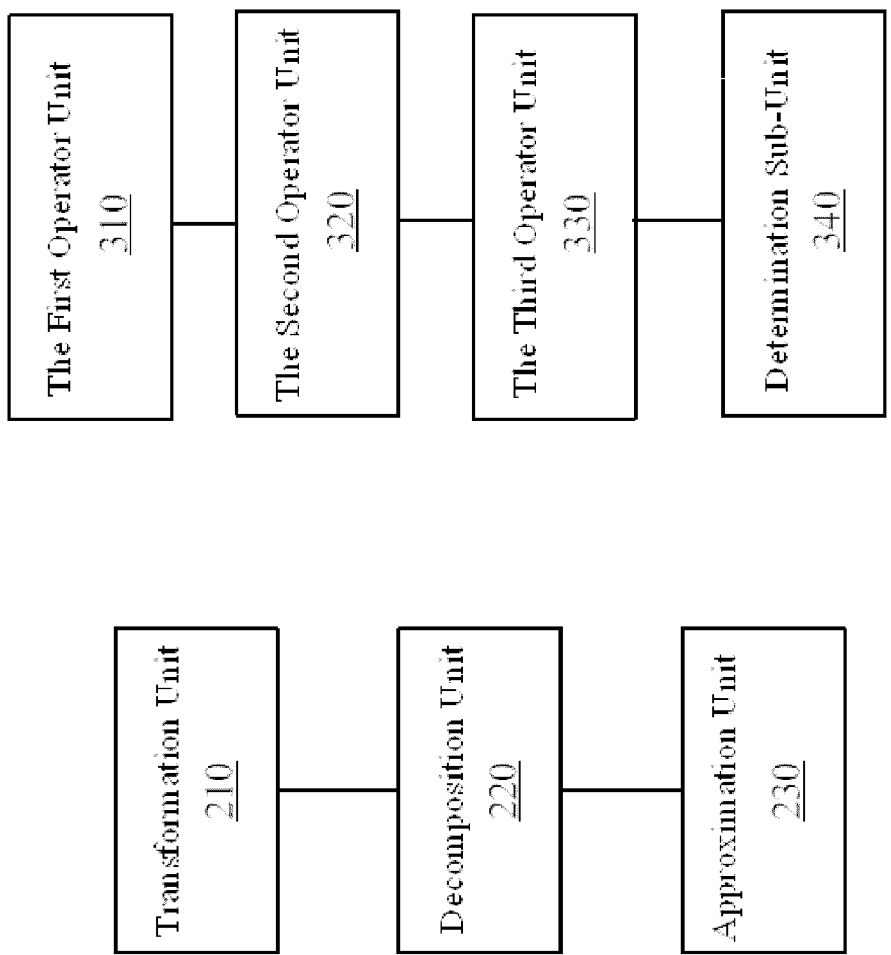
Figure 3
Figure 2

POWER AMPLIFYING DEVICE WITH LINEAR CORRECTOR

This application claims the benefit of Chinese Patent Application Number CN 201010140861.1 filed on Apr. 2, 1010, the disclosure of which is hereby expressly incorporated by reference in its entirety and hereby expressly made a portion of this application.

FIELD OF THE PRESENT INVENTION

The present invention is related to a power amplifying device with linear corrector and a wireless emission technique based on pre-distorter.

PRIOR ART

Power amplifier (PA) is one of the necessary devices in wireless communications systems. The improvement of its power efficiency is of significant importance to the energy saving and consumption reduction for wireless communications devices, especially for the portable mobile terminals. Base station, repeater station, TV broadcasting lunch tower utilized by wireless communications operators and other micro-communications devices such as mobile phone, mobile TV all involves the problem of PA power efficiency.

Distortion of transmitted signals caused by nonlinear characteristics of PA is one of the main reasons for the reduction of PA power efficiency. Therefore, it is of importance to take linearization techniques to improve the power efficiency of PA.

Generally speaking, power amplifier linearization techniques includes power back-off technique, envelope elimination and restoration technique, Cartesian feed-back technique, feed-forward linearization technique, linear amplification with non-linear components (LINC) technique and digital pre-distortion technique, etc. Among these linearization techniques, digital pre-distortion technique is widely used nowadays due to its high stability, applicability for wide band, pre-distortion accuracy, low implementation cost etc.

There are two main technical categories of for digital baseband pre-distortion: look-up table (LUT) based and polynomial based technique. Compared with the polynomial based pre-distortion technique, the LUT based pre-distortion technique has more excellent pre-distortion effects when the quantization bits for LUT are large enough. However, it needs large random access memory (RAM) storage and has a slow convergence speed. While, the polynomial-based pre-distorter has very small storage spaces requirements and faster converging speeds compared with the LUT-based technique. The fundamental principle of pre-distortion technique based on polynomial is the fitting of the inversion curves of PA complex gain curves by adjusting polynomial coefficients.

For PA pre-distortion technique based on polynomial, the computational complexity increases exponentially when the polynomial order is large, arising the difficulty for hardware implementation of PA. This may result in the poor stability of pre-distorter. Moreover, the polynomial order determines the pass band range of the filter and the linearization results directly when a pre-distorter is designed.

At present, pre-distortion techniques based on polynomial will generally result in much higher computational complexities if distinct pre-distortion effects are required. Similarly, if we want to lower the computation complexities, the polynomial order should be reduced accordingly, which will degrade the pre-distortion effects.

SUMMARY OF THE PRESENT INVENTION

The object of this invention is to provide a power amplifying device with linear corrector, which can guarantee the pre-distortion performance with low computation complexity. Much better convergence and stability performances will be achieved on the basis of polynomial based power amplifier pre-distorter.

This invention presents a power amplifying device with linear corrector, whose characteristics lies in that, its wireless emission utilizes polynomials to realize PA pre-distortion. The effective order of the described pre-distorter based on polynomials is determined by the effective order estimation method. Effective order estimation method for pre-distorter based on polynomials consists of the following steps: receive the polynomials of the pre-distorter and transform the polynomials into the matrix expression. The pre-distortion matrix composed of K pre-distortion functions is thus obtained, where K denotes the maximum polynomial order. Singular value decomposition is performed for the pre-distortion matrix. Then the singular value matrix is obtained. Based on the singular value matrix, we can get the effective rank of the pre-distortion matrix. This effective rank is determined as the effective order of the described polynomial. Such effective rank is the minimum rank of the Approximated Pre-distortion Matrix that can achieve the required approximation performances for the described pre-distortion matrix. The Approximated Pre-distortion Matrix is the matrix that approximates to the described pre-distortion matrix.

With this invention, good pre-distortion performance with low computational complexity can be achieved through the estimation of the effective order of polynomials, which is further guarantee the stability of the pre-distortion results.

BRIEF DESCRIPTION OF THE ACCOMPANYING DRAWINGS

FIG. 1 shows the flow diagram for the implementation of the polynomial based effective order estimation method.

FIG. 2 describes the component parts of the effective order estimator.

FIG. 3 shows the First Type of implementation way for the approximation unit in this invention.

FIG. 4 is the Second Type of implementation way for the approximation unit in this invention.

BEST MODE FOR CARRYING OUT THE PRESENT INVENTION

Figure 1:
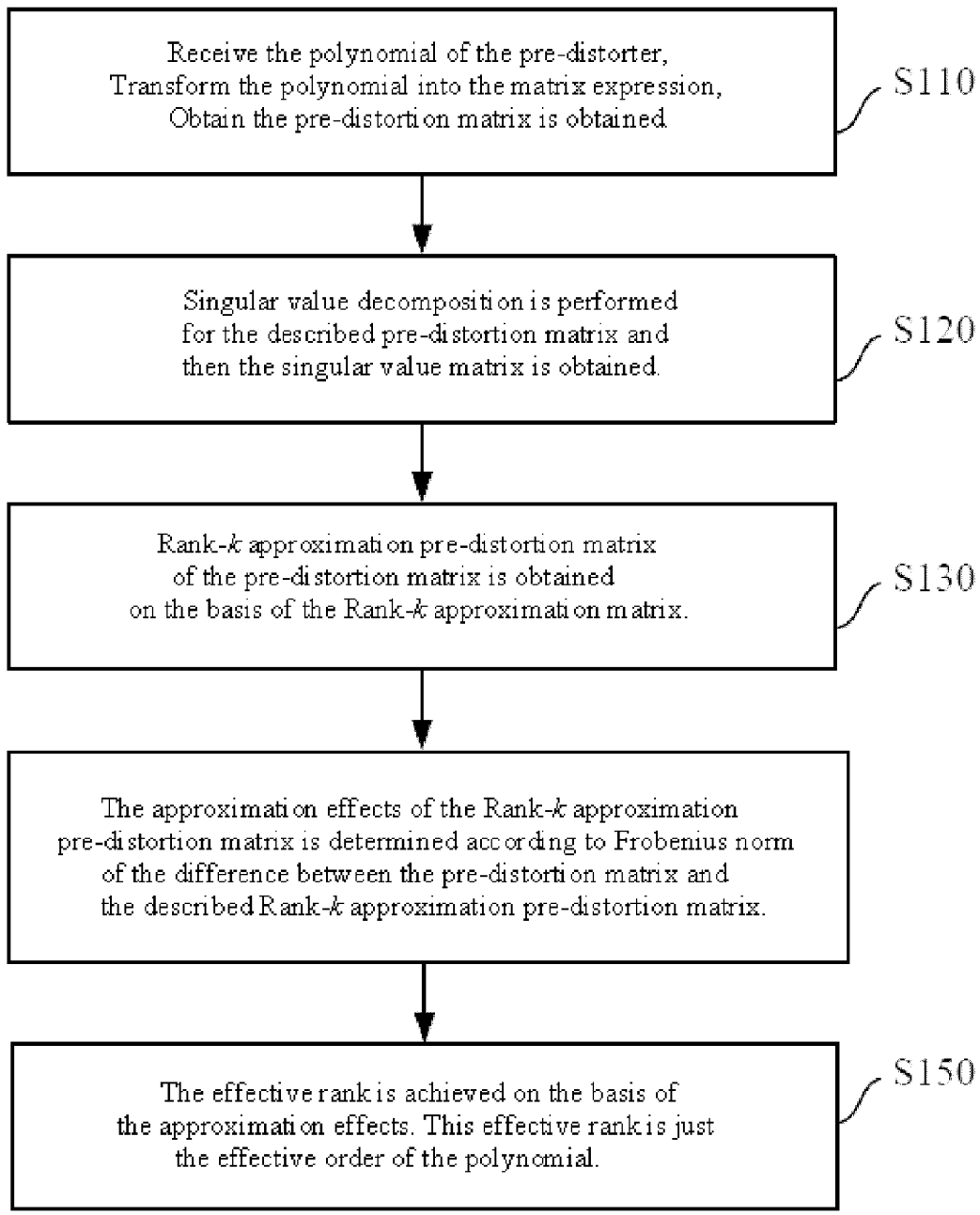

In order to clearly describe the technical scheme and the beneficial effects, further descriptions will be presented combined with the attached diagrams and implementation cases. Thus, the realization process of this invention may be understood adequately, which will make it much easier to implement.

The basic idea of this invention is to perform the effective order estimation of polynomials with the utilization of the singular value decomposition method. The estimated effective order is regarded as the polynomial order of the pre-distorter, which guarantees the superior performance of the pre-distorter with much lower computational complexity. Better pre-distortion results can be achieved with the polynomial based effective order pre-distorter compared with those conventional polynomial based pre-distortion techniques with no effective order estimation.

Polynomial z(n) of the pre-distorter can be expressed as:

$$z(n) = \sum_{k=1}^{K} a_k \phi_k(x(n)) \qquad (1)$$

where Equation (1) is an expression for pre-distorter based on polynomials.

$a_k$ denotes the polynomial coefficients.

$\phi_k(x(n))$ denotes the pre-distortion function corresponding to the kth-order polynomials.

x(n) denotes the input data sequences of the pre-distorter.
n denotes the index number of the input data sequences.
K denotes the maximum order of the polynomial.

Equation (1) can be expressed as follows in the form of matrix.

$$z = \Phi_x a \qquad (2)$$

where $z=[z(0), \ldots, z(N-1)]^T$ denotes the polynomial matrix of the pre-distorter. It consists of N elements $z(0), \ldots, z(N-1)$. The superscript T denotes the transpose of the matrix.

$a=[a_1, \ldots, a_K]^T$ denotes the coefficient matrix composed of K polynomial coefficients $a_1, \ldots, a_K$.

$\Phi_x=[\phi_1(x), \ldots, \phi_K(x)]$ denotes the pre-distortion matrix composed of K pre-distortion functions.

$x=[x(0), \ldots, x(N-1)]^T$ denotes the input matrix composed of N input data sequences $x(0), \ldots, x(N-1)$ of the pre-distorter.

$\phi_k(x)=[\phi_k(x(0)), \ldots, \phi_k(x(N-1))]^T$ denotes the pre-distortion function matrix composed of N input data sequences of the pre-distorter. Note that $\phi_k(x)$ denotes the matrix composed of pre-distortion function corresponding to the kth order polynomials. The above mentioned $\Phi_x$ denotes the pre-distortion matrix composed of some pre-distortion functions.

By this way, the problem of finding the effective order of the pre-distorter is transformed into the problem of finding the effective rank of the pre-distortion matrix $\Phi_x$. This invention presents two implementation ways to seek for the effective order of pre-distortion matrix $\Phi_x$. The first implementation way is to seek for the optimum approximation $\hat{\Phi}_x$ of K×N pre-distortion matrix $\Phi_x$ under Frobenius norm. The effective rank of pre-distortion matrix $\Phi_x$ is obtained on the basis of this optimum approximation $\hat{\Phi}_x$ and then, effective order of polynomials is obtained consequently. The second implementation way is to get the effective rank of the pre-distortion matrix $\Phi_x$ with the utilization of normalized singular value and then, the effective order of the polynomial can be obtained eventually.

In the first implementation way, that is, to seek for the optimum approximation $\hat{\Phi}_x$ of K×N pre-distortion matrix $\Phi_x$ under Frobenius norm, K denotes the maximum order of the polynomial. N denotes the number of input data sequences of the pre-distorter.

Singular value decomposition is performed for the pre-distortion matrix, i.e., $\Phi_x = U \Sigma V^H$. The singular matrix $\Sigma$ can then be obtained consequently. In essence, it is a matrix containing information of singular values. Where U and V are K×K matrix and N×N matrix, respectively. While, $\Sigma$ is a K×N matrix. The diagonal elements of the matrix $\Sigma$ is diag($\Sigma$)= $(\sigma_{11}, \sigma_{22}, \ldots, \sigma_{kk})$. Singular value $\sigma_{kk}$ is the diagonal element in the kth-row kth-column of the matrix $\Sigma$ after the singular value decomposition. The value range of k is(1, min(K, N)), where K, N denotes the number of row and column of the pre-distortion matrix $\Phi_x$, respectively. Singular value $\sigma_{kk}$ contains useful information about the characteristics of the rank of the pre-distortion matrix $\Phi_x$.

Through keeping the first k singular values invariant and set other singular values zeros, we can get matrix $\Sigma_k$, which is called the Rank-k Approximation Matrix of the matrix $\Sigma$. Equation (3) is then obtained as follows $$\Phi_x^{(k)} = U \Sigma_k V^H \qquad (3)$$

where $\Phi_x^{(k)}$ denotes the Rank-k Approximation Pre-distortion Matrix of the pre-distortion matrix $\Phi_x$. U is K-order K×K unitary matrix and V is N-order N×N unitary matrix.

The above mentioned approximation performances can be evaluated with the Frobenius norm $\|\Phi_x - \Phi_x^{(k)}\|_F$ of the matrix difference $\Phi_x - \Phi_x^{(k)}$ (which is also called approximation error vetor) as is expressed in Eq. (4). The smaller the value of $\|\Phi_x - \Phi_x^{(k)}\|_F$, the better the approximation performances.

$$\|\Phi_x - \Phi_x^{(k)}\|_F = \|U \Sigma V^H - U \Sigma_k V^H\|_F \qquad (4)$$

The norms of the K-order unitary matrix U and N-order unitary matrix V are $$\|U\|_F = \sqrt{K} \qquad (5)$$

$$\|V\|_F = \sqrt{N} \qquad (6)$$

Therefore, Eq. (4) can be simplified as $$\|\Phi_x - \Phi_x^{(k)}\|_F = \|U\|_F \cdot \left\|\Sigma - \sum_k\right\|_F \cdot \|V^H\|_F = \sqrt{KN} \left\|\Sigma - \sum_k\right\|_F = \sqrt{KN} \left[\sum_{i=k+1}^{min(K,N)} \sigma_{ii}^2\right]^{1/2} \qquad (7)$$

From Eq. (7), we can see that, the approximation accuracy of the Rank-k Approximation Pre-distortion Matrix $\Phi_x^{(k)}$ to the pre-distortion matrix $\Phi_x$ depends on the quadratic sum of those zero-set singular values.

It is evident from Eq. (7) that, the larger the value of k, the smaller the $\|\Phi_x - \Phi_x^{(k)}\|_F$. When k is satisfied with k=min(K, N), then $\|\Phi_x - \Phi_x^{(k)}\|_F$ approximates to zero. The minimum integer p satisfied with the predetermined approximation effects is called the effective order of the pre-distortion matrix $\Phi_x$. For instance, when k takes the value of p, the Frobenius norm of the approximation error vector $\Phi_x - \Phi_x^{(k)}$ is smaller than the predetermined threshold, indicating that the predetermined pre-distortion effects is achieved. Moreover, when k is larger than p, there is no distinct improvement for the approximation effects. p can then be determined as the effective rank of the pre-distortion matrix $\Phi_x$.

Therefore, the problem of seeking for the effective order of the polynomials is transformed into the problem of seeking for the effective rank of the pre-distortion matrix $\Phi_x$. The effective rank is determined through the approximation effects of Rank-k Approximation Pre-distortion Matrix $\Phi_x^{(k)}$ to the pre-distortion matrix $\Phi_x$. That is so say, the effective rank is the minimum rank of the approximation pre-distortion matrix that can achieve the predetermined approximation effects. In the following, detailed descriptions will be presented to show how to obtain the effective order of the pre-distortion matrix.

For example, set the First Threshold $\epsilon_1$, making it possible to achieve the predetermined approximation effects when $\|\Phi_x - \Phi_x^{(k)}\|_F$ is smaller than the First Threshold. Compute the $\|\Phi_x - \Phi_x^{(k)}\|_F$ and judge whether $\|\Phi_x - \Phi_x^{(k)}\|_F$ is smaller than the First Threshold $\epsilon_1$ or not. The minimum integer k satisfying with $\|\Phi_x - \Phi_x^{(k)}\|_F < \epsilon_1$ is determined as the effective rank p (that is the polynomial effective order of the pre-distorter).

When the singular value matrix $\Sigma$ is obtained, we can also utilize the normalized singular value to judge the approximation effects. Consequently, the normalized singular value method can be utilized to determine the effective rank of the pre-distortion matrix $\Phi_x$ as well. To be specific, Eq. (8) can be resorted to obtain the normalized singular value $\bar{\sigma}_{kk}$ $$\bar{\sigma}_{kk} \stackrel{def}{=} \sigma_{kk}/\sigma_{11},\ 1 \le k \le \min(K, N) \quad (8)$$

It is evident that $\bar{\sigma}_{11} = 1$.

Set a positive number $\epsilon_2$ approximating to zero as the Second Threshold, making it possible to achieve the predetermined approximation effects when the following effective rank determination way is followed: compute the normalized singular value $\bar{\sigma}_{kk}$, judge whether the normalized singular value $\bar{\sigma}_{kk}$ is larger than the Second threshold $\epsilon_2$ or not. The maximum integer k is determined as the effective rank p (i.e. polynomial effective order of the pre-distorter) when the normalized singular value $\bar{\sigma}_{kk}$ is larger than the Second Threshold $\epsilon_2$.

There are two schemes to determine the effective order. One is the utilization of the Frobenius norm of approximation error vector $\Phi_x - \Phi_x^{(k)}$ and the other is the utilization of the normalized singular value.

FIG. 1 shows the flow diagram of the implementation case of polynomial effective order estimation method. We will take an example of the implementation case of the first approximation method. This estimation method includes mainly the following steps, just as shown in FIG. 1.

Step 110. Receive the polynomial of the pre-distorter $$z(n) = \sum_{k=1}^{K} a_k \phi_k(x(n))$$

and then, transform the polynomial z(n) of the pre-distorter into the matrix format $z = \Phi_x a$ with pre-distortion matrix $\Phi_x = [\phi_1(x), \ldots, \phi_K(x)]$. Pre-distortion matrix $\Phi_x$ is consisted of K pre-distortion functions obtained. Where $\phi_k(x)$ denotes the matrix consisted by the pre-distortion function corresponding to the kth order polynomial.

Step 120. Singular value decomposition is performed for the pre-distortion matrix $\Phi_x$, i.e. $\Phi_x = U\Sigma V^H$. Thus, we can obtain the singular value matrix $\Sigma$. The diagonal elements of the singular value matrix $\Sigma$ is $diag(\Sigma) = (\sigma_{11}, \sigma_{22}, \ldots, \sigma_{kk})$. Singular value $\sigma_{kk}$ is the diagonal element of the kth-row kth-column of the singular value matrix $\Sigma$ after singular value decomposition.

Step 130. On the basis of the Rank-k Approximation Matrix $\Sigma_k$ of the matrix $\Sigma$, the Rank-k Approximation Pre-distortion Matrix $\Phi_x^{(k)}$ of the pre-distortion matrix $\Phi_x$ is obtained. Where, the first k singular value of $\Sigma$ keep invariant and other singular values are set to be zeros. Based on which, we can get the Rank-k Approximation Matrix $\Sigma_k$ of the singular value $\Sigma$. As for the acquisition of $\Phi_x^{(k)}$, Eq. (3) can be referenced.

Step 140. To judge the approximation effects, the magnitude of Frobenius norm of matrix difference $\Phi_x - \Phi_x^{(k)}$ can be utilized to evaluate the above mentioned approximation effects. $\|\Phi_x - \Phi_x^{(k)}\|_F$ can be referenced from Eq. (4) to Eq. (7).

Step 150. Effective rank p of the pre-distortion matrix $\Phi_x$ is achieved on the basis of this approximation effects. Effective rank p is just the effective order of the polynomial.

FIG. 2 shows the component diagram for the implementation case of the polynomial based effective order estimator. Combined with the implementation case shown in FIG. 1, the estimation module shown in FIG. 2 consists mainly of Transformation Unit 210, Decomposition Unit 220 and Approximation Unit 230.

Transformation Unit 210 is used to receive the polynomial z(n) of the pre-distorter, where $$z(n) = \sum_{k=1}^{K} a_k \phi_k(x(n)).$$

Corresponding pre-distortion matrix $\Phi_x$ is obtained on the basis of this polynomial z(n) and then, the polynomial z(n) is transformed as the matrix $z = \Phi_x a$. Thus, we can get the matrix $\Phi_x$.

Decomposition Unit 220 is used to take singular value decomposition for the pre-distortion matrix, i.e. $\Phi_x = U\Sigma V^H$. Singular value matrix $\Sigma$ is then obtained Where, U and V are K×K and N×N matrixes, respectively. $\Sigma$ is a K×N matrix, where K,N denotes the number of row and the number of column of the pre-distortion matrix $\Phi_x$, respectively.

Approximation Unit 230 is used to obtain the effective rank of the pre-distortion matrix $\Phi_x$ on the basis of singular value matrix $\Sigma$ and the predefined approximation threshold. The effective rank of the pre-distortion matrix $\Phi_x$ is just the effective order of the polynomial z(n).

FIG. 3 presents the first implementation way of the Approximation Unit 230. Just as is shown in FIG. 3, the Approximation Unit 230 in the first implementation way consists mainly of the First Operator Unit 310, the Second Operator Unit 320 and the Third Operator Unit 330.

First Operator Unit 310 is used to keep the first k singular values of the singular value matrix invariant and set other singular values to be zeros. Consequently, we can get the Rank-k approximation matrix of the singular value matrix.

Second Operator Unit 320 is utilized to obtain Rank-k Approximation Pre-distortion Matrix of the pre-distortion matrix on the basis of Rank-k Approximation Matrix.

Third Operator Unit 330 is used to compute the magnitude of Frobenius norm of the difference between pre-distortion matrix and Rank-k Approximation Matrix.

Determination Unit 340 is used to determine the effective rank of the pre-distortion matrix on the basis of approximation effects of Rank-k Approximation Pre-distortion Matrix to pre-distortion matrix. Where the First Threshold is the approximation threshold. The magnitude of Frobenius norm of the difference between pre-distortion matrix and Rank-k Approximation Pre-distortion Matrix is utilized to evaluate the approximation effects. When this value is less than the First Threshold, the approximation effects achieve. When the magnitude of Frobenius norm of the difference between pre-distortion matrix and Rank-p Approximation Pre-distortion Matrix is less than or equal to the First Threshold and, the magnitude of Frobenius norm of the difference between pre-distortion matrix and the Rank-k(k<p) Approximation Pre-distortion Matrix is greater than the First Threshold, then p is determined as the effective rank of the pre-distortion matrix $\Phi_x$, i.e. the effective order of the polynomial. As for the computation of Frobenius norm of the difference between pre-distortion matrix and the Rank-k Approximation Pre-distortion Matrix, we can reference from Eq. (4) to Eq. (7).

FIG. 4 shows the second implementation way of the Approximation Unit 230 in this invention. The Approximation Unit 230 in the second implementation way consists mainly of Normalized Value Computation Sub-unit 410 and Determination Sub-unit 420.

Normalized Value Computation Sub-unit 410 is used for the normalization of the singular value $\sigma_{kk}$ in the singular value matrix on the basis of the elements of the first-row first-column in the singular value matrix, from which the normalized value $\bar{\sigma}_{kk}$ of singular value $\sigma_{kk}$ is obtained.

Determination Sub-unit 420 is utilized to judge the approximation effects according to the normalized value $\bar{\sigma}_{kk}$. If the normalized singular value $\bar{\sigma}_{kk}$ is greater than the Second Threshold $\epsilon_2$, then the approximation effects will not be achieved. While, on the basis of the Second Threshold and the normalization value, the effective rank of the pre-distortion matrix is obtained. Specifically, if the normalized singular value $\bar{\sigma}_{pp}$ is greater or equal to the Second Threshold $\epsilon_2$ and, $\bar{\sigma}_{kk}(p<k\leqq K)$ is less than the Second Threshold $\epsilon_2$, then the integer p can be taken as the effective rank. Where the Second Threshold is the approximation threshold.

It can guarantee the superior performances with low computational complexity when power amplifying device with the above mentioned effective order estimation processing method is used. Thus, the power efficiency of the power amplifier can be improved effectively.

Figure 5:
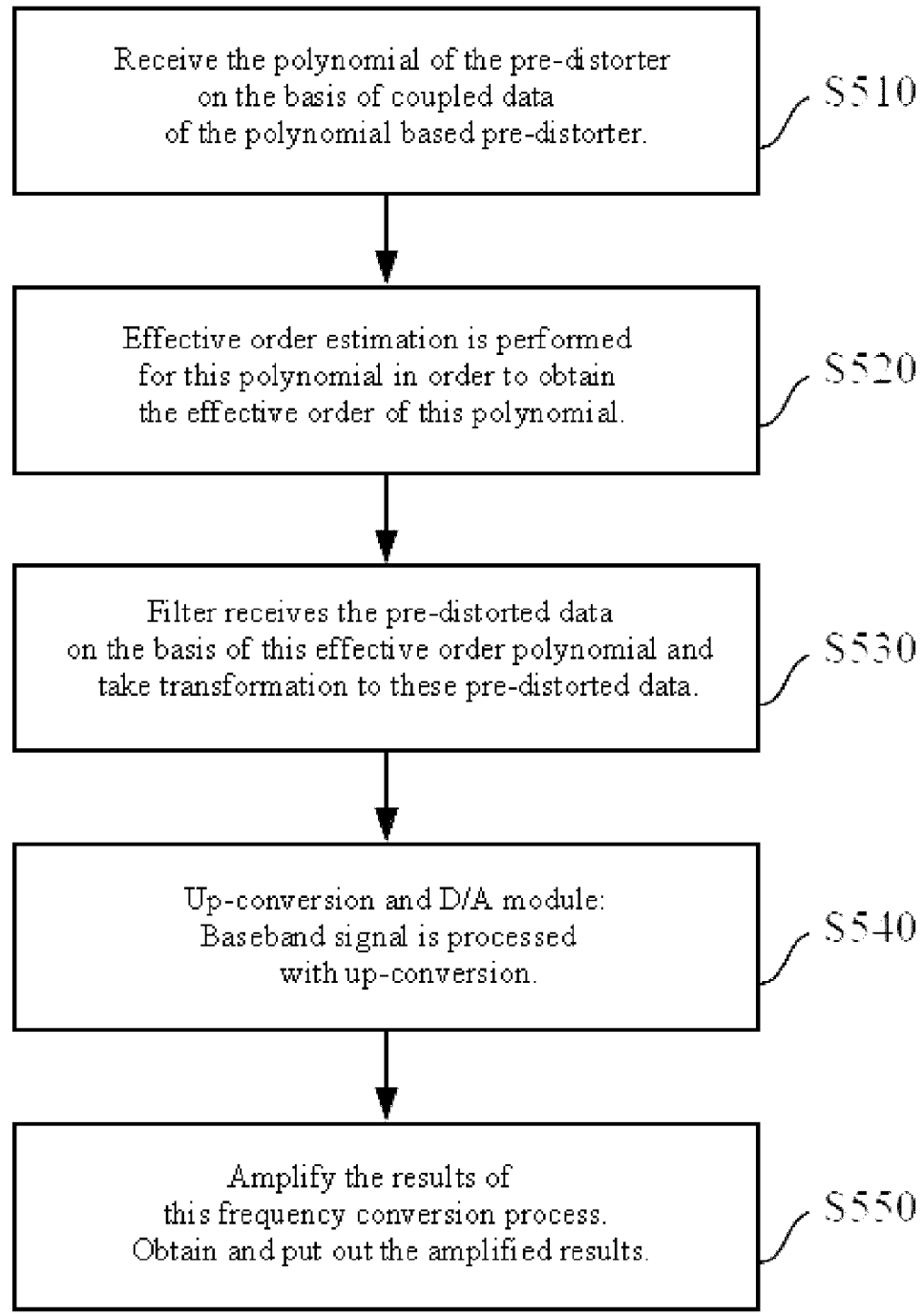
FIG. 5 shows the flow diagram for the implementation case of the wireless emission way in this invention.

FIG. 5 is the flow diagram of the implementation case of wireless emission method. Combined with the implementation case of the effective order estimation method shown in FIG. 1 and the implementation case of the effective order pre-distorter shown in FIG. 2, the implementation way of power amplifying method shown in FIG. 1 consists mainly of the following steps.

Step S510. Coupled data is received based on polynomial pre-distorter. Polynomial of the pre-distorter is then obtained.

Step S520. Effective order estimation is performed regarding to the polynomial in order to obtain the effective order of this polynomial.

Step S530. Filter receives the pre-distorted data based on the effective order polynomial. Transformation is taken for this pre-distorted data in order to change the signal spectrum, making it more suitable for channel transmission.

Step S540. Up-conversion processing is performed for the base-band signal by Up-conversion and D/A module.

Step S550. The frequency-conversion processing, i.e., radio frequency is amplified in order to obtain the amplifying results.

Effective order estimation for this polynomial and the acquisition of this effective order in the above mentioned S520 step is shown in FIG. 1.

Figure 6:
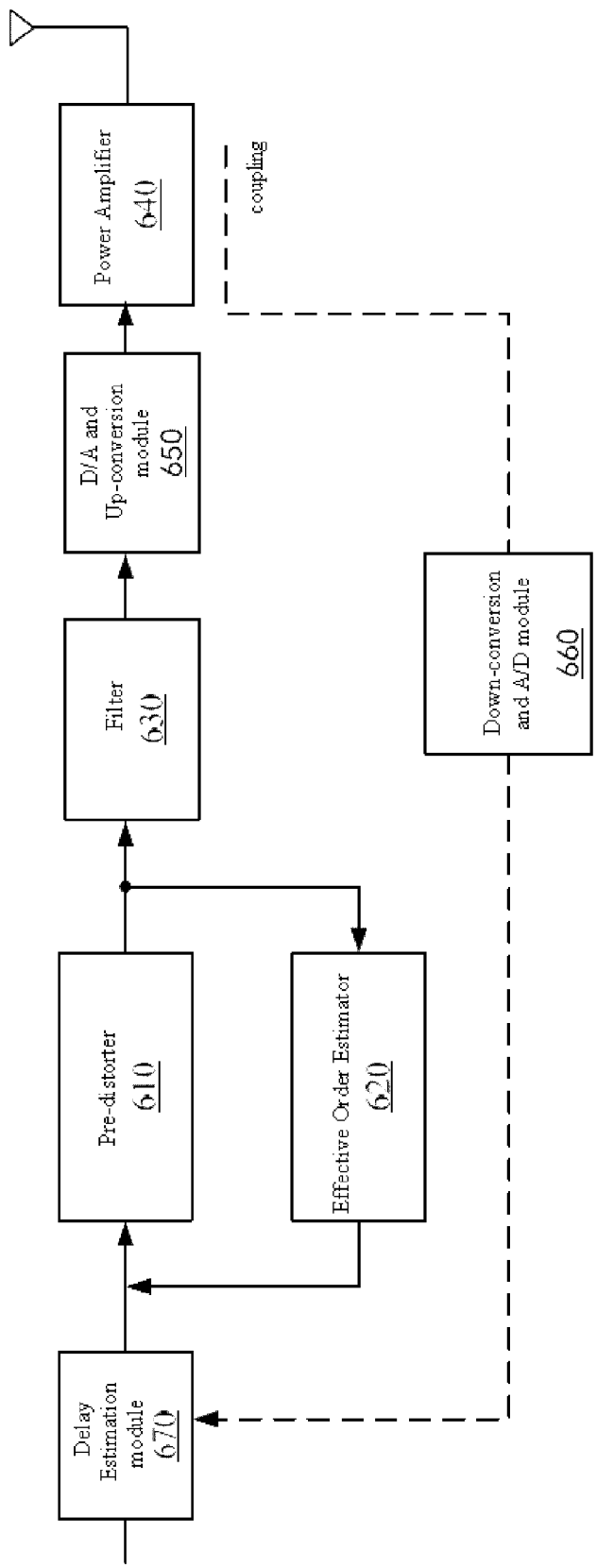
FIG. 6 is the diagram of implementation case of wireless emission device with pre-distortion function in this invention.

FIG. 6 presents the component diagram for the implementation case of wireless emission device with pre-distortion function. Combined with the implementation case of the effective order estimation method shown in FIG. 1, the implementation case of the effective order estimator shown in FIG. 2, and the implementation case of the wireless communications emission method with pre-distortion functions shown in FIG. 5, the wireless emission device with pre-distortion functions shown in FIG. 6 consists mainly of the following modules.

Pre-distorter 610 is used to receive the coupled and base-band-demodulated data in order to obtain the polynomial. This polynomial is then transmitted to the Effective Order Estimator 620. The Effective order of the polynomial feedback from Effective Order Estimator 620 is received. Effective order will then be transmitted to Filter 630 as the polynomial order.

Effective Order Estimator 620, connecting with Pre-distorter 610, is used to perform the effective order estimation for polynomial to obtain the effective order of the polynomial.

Filter 630, connecting with Pre-distorter 610, is used to receive the pre-distorted data based on effective order polynomial and then, filtering is performed for the pre-distorted data. The filtering results is transmitted to D/A and Up-conversion module 650.

Digital to analog transformation is carried out for the output results of Filter 630 in D/A and Up-conversion module 650. Thereby, we can get frequency conversion processing results, i.e., radio frequency data.

Power Amplifier 640, connecting with D/A and Up-conversion module 650, is used to amplify the radio frequency data with the amplified output results.

Down conversion and analog to digital transformation is carried out for the coupled feedback data sequence by Down-conversion and A/D module 660 and then, the transformation results is output to Delay Estimation module 670.

The comparison between the delayed input data sequence and the coupled feedback and demodulated baseband data sequence is carried out in Delay Estimation module 670. The difference between coupled feedback and demodulated baseband data sequence and original data (i.e. ideal data) is analyzed in order to make adjustment for the Pre-distorter 610.

The process of the Effective order estimation in Effective Order Estimator 620 can reference the implementation case of effective order estimation method shown in FIG. 1 and the effective order estimation module shown in FIG. 2.

Delay Estimation module in FIG. 6 is located in the left end and is used for data comparison.

Effective order estimation technique in this invention improves the pre-distortion effects with low system cost and computational complexity. Moreover, the performance of the convergence and stability of the pre-distorter improves due to the decrease of the polynomial order.

The pre-distorter in this invention has the advantages of low computational complexity, high stability and fast convergence. It is suitable for the large-scale communication network devices in base station, repeater station, TV broadcasting tower and portable mobile terminals such as mobile phone, mobile TV and so on.

The implementation way, though is just as what is described above, the described content is for the easiness of understanding but not for the limitation of this invention. The technician in the related technical field can make any revisions and changes in the concrete form and details without dispatching the exposed sprit and ranges. But these changes and revisions should be included within the protection range of this patent.

What is claimed is:
1. A power amplifying device for wireless communication comprising:
 a linear corrector that is configured to make pre-distortion functions into reality through a polynomial based format, said linear corrector comprising at least one processor to perform a polynomial based pre-distortion, wherein said processor is:
  configured to receive a polynomial of a pre-distorter;
  configured to transform the pre-distorter into a matrix, from which the pre-distortion matrix comprising K pre-distortion functions is obtained, where K denotes a maximum order of the polynomial;

configured to obtain a singular value matrix through decomposition of a singular value; and configured to obtain an effective rank of the pre-distortion matrix on the basis of the singular value matrix, in which the effective rank of the pre-distortion matrix is determined as an effective order of the polynomial, wherein the effective rank of the described pre-distortion matrix is a minimum rank of the approximation pre-distortion matrix that can achieve the predetermined pre-distortion effects, and the approximation pre-distortion matrix is a matrix that approximates the pre-distortion matrix.

2. The power amplifying device according to claim 1, wherein said processor is:

further configured to transform the polynomial into a matrix expression in order to acquire the pre-distortion matrix, wherein said transformation of the polynomial into the matrix expression comprises:

transforming the polynomial of the described pre-distorter, $$z(n) = \sum_{k=1}^{K} a_k \phi_k(x(n)),$$

into the matrix format as $z=\Phi_x a$; and obtaining the pre-distortion matrix $\Phi_x$, where k denotes a series number of an order of the polynomial;

$a_k$ denotes a coefficient of the polynomial;

$\phi_k(x(n))$ denotes a pre-distortion function corresponding to a kth order of the polynomial;

x(n) denotes input data sequences of the pre-distorter;

n denotes a series number of the input data sequences;

$z=[z(0), \ldots, z(N-1)]^T$ denotes the polynomial matrix of the pre-distorter, consisting of N elements z(0), ..., z(N−1), and T denotes a transposition of the polynomial matrix;

$a=[a_1, \ldots, a_K]^T$ denotes coefficients matrix consisted by K polynomial coefficients $a_1, \ldots, a_K$;

$\Phi_x=[\phi_1(x), \ldots, \phi_K(x)]$ denotes a pre-distortion matrix consisted by K pre-distortion functions;

$x=[x(0), \ldots, x(N-1)]^T$ denotes an input matrix consisted by N input data sequence x(0), ..., x(N−1) of the pre-distorter; and $\phi_k(x)=[\phi_k(x(0)), \ldots, \phi_k(x(N-1))]^T$ denotes the pre-distortion function matrix consisted by N input data sequences.

3. The power amplifying device according to claim 1, characterized in that, by keeping a first k singular value of the singular value matrix invariant and setting other singular value to be zero, a Rank-k Approximation Singular Value Matrix of the singular value matrix is obtained, then on the basis of the Rank-k Approximation Singular Value Matrix, the approximate pre-distortion matrix of the pre-distortion matrix is obtained, when Frobenius norm of a difference between the pre-distortion matrix and the approximation pre-distortion matrix is less than or equal to a First Threshold, it is then determined that the approximation pre-distortion matrix can achieve the predetermined approximation effects.

4. The power amplifying device according to claim 1, characterized in that, singular values $\sigma_{kk}$ of the singular value matrix are normalized based on an element of a first-row first-column of the singular value matrix, thus, a normalized value $\overline{\sigma}_{pp}$ of a singular value $\sigma_{pp}$ is obtained, if the normalized value $\overline{\sigma}_{pp}$ is greater than or equal to a Second Threshold, it is then determined that the approximate pre-distortion matrix with rank p can achieve the predetermined approximation effects, where 1<p<K.

5. The power amplifying device according to claim 4, characterized in that, if for arbitrary value of k satisfying with p<k≦K, $\overline{\sigma}_{kk}$ is less than the Second Threshold, then p is a minimum rank of the approximation pre-distortion matrix that can achieve the predetermined approximation effects.

6. A method of wireless communication comprising:

amplifying signals using the power amplifying device according to claim 1; and distorting the amplified signals using a polynomial based pre-distorter;

wherein said distorting comprises estimating an effective order of the polynomial of the polynomial-based pre-distorter, said estimating comprises:

receiving the polynomial of the pre-distorter;

transforming the pre-distorter into a matrix, from which the pre-distortion matrix comprising K pre-distortion functions is obtained, where K denotes a maximum order of the polynomials; and obtaining a singular value matrix through decomposition of a singular value;

obtaining an effective rank of the pre-distortion matrix on the basis of the singular value matrix, in which the effective rank of the pre-distortion matrix is determined as the effective order of the polynomials, wherein the effective rank of the pre-distortion matrix is a minimum rank of an approximation pre-distortion matrix that can achieve predetermined pre-distortion effects, and the approximation pre-distortion matrix is a matrix that approximates the pre-distortion matrix.

7. The method according to claim 6 further comprising:

trnasforming the polynomial into a matrix expression in order to acquire the pre-distortion matrix, wherein said transformation of the polynomial into the matrix expression comprises:

transforming the polynomial of the described pre-distorter, $$z(n) = \sum_{k=1}^{K} a_k \phi_k(x(n)),$$

into the matrix format as $z=\Phi_x a$; and obtaining the pre-distortion matrix $\Phi_x$, where k denotes a series number of an order of the polynomial;

$a_k$ denotes a coefficient of the polynomial;

$\phi_k(x(n))$ denotes a pre-distortion function corresponding to a kth order of the polynomial;

x(n) denotes input data sequences of the pre-distorter;

n denotes a series number of the input data sequences;

$z=[z(0), \ldots, z(N-1)]^T$ denotes the polynomial matrix of the pre-distorter, consisting of N elements z(0), ..., z(N−1), and T denotes a transposition of the polynomial matrix;

$a=[a_1, \ldots, a_K]^T$ denotes coefficients matrix consisted by K polynomial coefficients $a_1, \ldots, a_K$;

$\Phi_x=[\phi_1(x), \ldots, \phi_K(x)]$ denotes a pre-distortion matrix consisted by K pre-distortion functions;

$x=[x(0), \ldots, x(N-1)]^T$ denotes an input matrix consisted by N input data sequence x(0), ..., x(N−1) of the pre-distorter; and $\phi_k(x)=[\phi_k(x(0)), \ldots, \phi_k(x(N-1))]^T$ denotes the pre-distortion function matrix consisted by N input data sequences.

8. The method according to claim 6, characterized in that, by keeping a first k singular value of the singular value matrix invariant and setting other singular the value to be zero, a Rank-k Approximation Singular Value Matrix of the singular value matrix is obtained, then on the basis of the Rank-k Approximation Singular Value Matrix, the approximate pre-distortion matrix of the pre-distortion matrix is obtained, when Frobenius norm of a difference between the pre-distortion matrix and the approximation pre-distortion matrix is less than or equal to a First Threshold, it is then determined that the approximation pre-distortion matrix can achieve the predetermined approximation effects.

9. The method according to claim 6, characterized in that, singular values $\sigma_{kk}$ of the singular value matrix are normalized based on an element of a first-row first-column of the singular value matrix, thus, a normalized value $\bar{\sigma}_{pp}$ of a singular value $\sigma_{pp}$ is obtained, if the normalized value $\bar{\sigma}_{pp}$ is greater than or equal to a Second Threshold, it is then determined that the approximate pre-distortion matrix with rank p can achieve the predetermined approximation effects, where $1<p<K$.

10. The method according to claim 9, characterized in that, if for arbitrary value of k satisfying with $p<k\leqq K$, $\bar{\sigma}_{kk}$ is less than the Second Threshold, then p is a minimum rank of the approximation pre-distortion matrix that can achieve the predetermined approximation effects.

* * * * *